(12) United States Patent
Sakamoto et al.

(10) Patent No.: US 8,698,010 B2
(45) Date of Patent: Apr. 15, 2014

(54) ELECTRONIC APPARATUS, IMAGE DISPLAY APPARATUS AND METHOD OF COOLING ELECTRONIC APPARATUS

(75) Inventors: Hitoshi Sakamoto, Tokyo (JP); Kazuyuki Mikubo, Tokyo (JP); Takeya Hashiguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 466 days.

(21) Appl. No.: 13/054,283

(22) PCT Filed: Apr. 10, 2009

(86) PCT No.: PCT/JP2009/057347
§ 371 (c)(1),
(2), (4) Date: Jan. 14, 2011

(87) PCT Pub. No.: WO2010/007821
PCT Pub. Date: Jan. 21, 2010

(65) Prior Publication Data
US 2011/0114384 A1 May 19, 2011

(30) Foreign Application Priority Data

Jul. 17, 2008 (JP) ................................ 2008-186178

(51) Int. Cl.
*H05K 7/20* (2006.01)

(52) U.S. Cl.
USPC ........... 174/547; 361/688; 361/692; 361/694; 361/695; 361/714

(58) Field of Classification Search
USPC ........... 174/547; 361/688, 692, 694, 695, 714
See application file for complete search history.

(56) References Cited

U.S. PATENT DOCUMENTS

| 5,424,915 | A  | * | 6/1995 | Katooka et al. | 361/695 |
| 5,831,847 | A  | * | 11/1998 | Love | 363/141 |
| 6,222,729 | B1 | * | 4/2001 | Yoshikawa | 361/695 |
| 7,038,911 | B2 | * | 5/2006 | Foster et al. | 361/695 |
| 7,164,586 | B2 | * | 1/2007 | Lin | 361/714 |
| 2002/0027766 | A1 | * | 3/2002 | Negishi | 361/645 |
| 2005/0207117 | A1 | * | 9/2005 | Hutchinson et al. | 361/694 |

FOREIGN PATENT DOCUMENTS

| JP | 2000-156581 | 6/2000 |
| JP | 2003-021823 | 1/2003 |
| JP | 2004-031539 | 1/2004 |

(Continued)

OTHER PUBLICATIONS

Machine Translation of JP 2005-181799A: Katayama, Display Device, Jul. 7, 2005.*

(Continued)

*Primary Examiner* — Timothy Thompson
*Assistant Examiner* — Sherman Ng
(74) *Attorney, Agent, or Firm* — Young & Thompson

(57) ABSTRACT

Resistivity to dust and cooling performance are improved by a simple structure. Electronic apparatus (image display apparatus) 1 includes: housing 31 that forms sealed inner space 33; circuit unit 39 that is provided in inner space 33; first partition plate 34 that is provided in inner space 33 and that has upper/lower partition portion 7, wherein upper/lower partition portion 7 at least partially extends in a lateral direction extending above at least a part of circuit unit 39 and that terminates in front of both lateral sides of housing 31; and first fan 5, 6 that is provided through upper/lower partition portion 7.

9 Claims, 17 Drawing Sheets

(56) References Cited

FOREIGN PATENT DOCUMENTS

| JP | 2004-158641 | 6/2004 |
| JP | 2004-294863 | 10/2004 |
| JP | 2005-181799 | 7/2005 |
| JP | 2005181799 A * | 7/2005 |
| JP | 3975506 | 6/2007 |

OTHER PUBLICATIONS

International Search Report/ PCT/JP2009/057347, May 19, 2009.

* cited by examiner

→ High Temperature Air Flow
--→ Low Temperature Air Flow

→ High Temperature Air Flow
---▶ Low Temperature Air Flow

⟶ High Temperature Air Flow
⇢ Low Temperature Air Flow

······▶ High Temperature Air Flow
-----▶ Low Temperature Air Flow

→ High Temperature Air Flow
⇢ Low Temperature Air Flow

ELECTRONIC APPARATUS, IMAGE DISPLAY APPARATUS AND METHOD OF COOLING ELECTRONIC APPARATUS

TECHNICAL FIELD

The present invention relates to an electronic apparatus, an image display apparatus and a method of cooling the electronic apparatus, and particularly, to a cooling structure for a sealed type large liquid crystal display apparatus that is installed in a semi-outdoor public place, such as a station platform, a station yard and an airport lobby.

BACKGROUND ART

Recently, electronic apparatuses have been developed with an increase in mounting density of components, in size and in various places for installation. The electronic apparatuses have been handled as precision devices and consideration have been given to the operating environment so far. However, it is expected that in the future the use of apparatuses in places where they have not been previously used will require that these apparatuses be able to withstand elements within the environment.

As an example, installation of large image display apparatuses in public places has been promoted. In order to display a lot of information on station platforms or in airports, there is an increasing need for image display apparatuses, such as liquid crystal types, instead of conventional image display apparatuses that use light emitting diodes (LED) or the like. The liquid crystal display apparatus includes liquid crystal and electronic components that are vulnerable to high temperature or dust. To address this problem, the long-term reliability of liquid crystal display apparatuses needs to be comparable to that of conventional image display apparatuses.

Due to the enhancement of product value brought by an increase in screen size and brightness, power consumption of the backlight used for a light source and of the power supply unit in the image display apparatus is increasing. Also, with enhancement of product performance due to voice function and the incorporation of a personal computer function into the image display apparatus, total power consumption of the image display apparatus tends to increase.

One of the element technologies that is required in order to achieve high reliability of the image display apparatus of this type, such as uniform image quality of the panel and long life, is a cooling technology that will satisfy temperature requirements that will ensure operation of a light source component, a control component and a power supply component. Unlike a liquid crystal display apparatus used as a home television set, an image display apparatus used in public places is typically operated continuously and is required to be resistant to elements within the environment depending on the place where the apparatus is installed. When used on a station platform or the like, the image display apparatus should not be vulnerable to electrically conductive dust or to a hot and humid environment. Further, the surface of a large liquid crystal panel cooled by natural convection tends to have a larger temperature difference between upper and lower parts as the size increases, and an excessive temperature difference impairs uniformity of image quality. Thus, cooling technology is needed for a large image display apparatus used in public places.

FIG. 1 is an exploded view of a liquid crystal display apparatus relating to the present invention. Components, such as fluorescent lamp 103 used as a backlight, are provided behind liquid crystal panel 102. Electrodes 104 and 105 are provided at both ends of the lamp, i.e., at both ends of the image display apparatus. Reflector 106 is provided in order to obtain uniform brightness. The temperature on the panel surface needs to be as uniform as possible because a variation in temperature on the surface of the liquid crystal panel causes a variation in light emission of the panel. For this purpose, a space is provided between liquid crystal panel 102 and back chassis 108 in order to obtain uniform brightness by the diffusion of light. Due to convection that occurs in the space, a temperature difference easily occurs particularly in the vertical direction. Thus, thermal diffusion sheet 107 using graphite etc. may be provided on reflector 106 on the side of the back chassis in order to promote thermal diffusion. The space starting from liquid crystal panel 102, located on the front surface, to thermal diffusion sheet 107 may be configured as a sealed structure which prevents dust or the like from entering therein from the outside in order to obtain stable and uniform brightness. When a liquid crystal display panel of the liquid crystal display apparatus using these components is cooled, it is important to cool the lamp, which is the major heat generating component inside the apparatus, while preventing direct contact with the outside air.

In general, this purpose is achieved by providing an intake port having a filter and an exhaust port for introducing ambient air at relatively low temperature into an image display apparatus and by cooling the light source component, the control component and the power supply component mounted in the apparatus with the ambient air. The filter on the intake port prevents entry of dust to some extent. However, this method regularly requires replacing of the filter. Further, fine dust enters an image display apparatus through the filter when the apparatus is installed in semi-outdoor public places. Electrically nonconductive and conductive fine dust floating in the outside air is deposited on the light source component, the control component and the power supply component in the apparatus. In particular, when electrically conductive dust enters the apparatus, a short circuit may occur between electronic circuit components mounted in the apparatus. Occurrence of a short circuit prevents improvement in reliability and causes a large problem in enhancing product value.

Thus, studies have been conducted to provide image display apparatuses that are excellent in dust resistivity and cooling performance and that are suitable for installation in semi-outdoor public places. For example, JP3975506B (hereinafter referred to as Patent Document 1) discloses an image display apparatus having a dust-proof container that houses a fluorescent lamp for a liquid crystal display panel. The container is formed by an image display unit on the front side and by a reflector on the back side. Air heated by the fluorescent lamp is led into square U-shaped ducts provided on both sides of the image display apparatus, is then cooled in the ducts, and then returned to the container. This arrangement provides a certain effect for satisfying requirements in which the apparatus will be able to withstand dust and in which the fluorescent lamp will be cooled.

JP2003-21823A and JP2004-294863A describe cooling technology for a liquid crystal panel and an image display apparatus having a power supply with high cooling performance, respectively.

DISCLOSURE OF THE INVENTION

The cooling technology described in Patent Document 1 is only intended to cool the lamp for a liquid crystal display panel. However, the liquid crystal display apparatus requires other circuit units, such as a control board that controls the content of the display and a power supply unit that supplies power to the panel and the control board. In recent years, optional devices that function as, for example, a personal computer or that have a voice function, are often mounted in response to diverse needs of the users of the apparatus. The board components and optional devices are vulnerable to dust and it is desirable that the entire liquid crystal display apparatus including these components and devices have a dust-proof structure.

In recent liquid crystal display apparatuses, about 60% of the total generated heat is occupied by the light source including a fluorescent lamp and an inverter circuit unit, and about 40% is occupied by the voice function, the personal computer function and electronic circuit components that are mounted in the power supply unit. Thus, only providing the fluorescent lamp with a dust-proof structure and cooling means is not sufficient to ensure resistivity against dust that floats in the outside air and to ensure cooling performance that meets temperature requirements for all the mounted components, such as the voice function, the function as a personal computer and the power supply unit, for the outside temperature. As a result, sufficient reliability cannot be obtained.

In order to prevent dust from entering the apparatus, it is preferable to use a sealed type liquid crystal display apparatus having a sealed structure that houses all the components that are necessary for a liquid crystal display apparatus to operate independently. However, since outside air does not enter the sealed type liquid crystal display apparatus, each component is cooled by high temperature air. Generally, providing a fan for each component is one solution, but it is not efficient to provide fans for a lot of components. Fans themselves may become obstacles against cooling.

As described above, electronic apparatuses installed in outdoor or semi-outdoor environments are required to be able to withstand elements within the environment. For example, it must be considered that temperatures in an environment will reach 40° C. in the summer. In addition, it is necessary to prevent dust that floats in the outside air from entering the apparatus in order to ensure reliability of the components mounted in the apparatus. Since the dust-proof structure does not allow the entry of outside air for cooling, it cannot be expected that the apparatus will be cooled by outside air at relatively low temperature.

The lifetime of the liquid crystal panel and temperature are closely related to each other. When the environment temperature is 40° C., the temperature of the liquid crystal panel needs to be 55° C. or less including design margin in order to ensure long-term reliability of the liquid crystal panel. An image display apparatus installed in public places needs higher reliability than a home-use image display apparatus due to the importance of the content that is displayed, the large number of installed display apparatus, in addition to the need for continuous operation of the display apparatuses. However, the sealed type casing and high environment temperature are disadvantageous conditions for cooling. Further, an increase in screen size and a reduction in thickness, weight and cost are desired for liquid crystal display apparatuses. Thus, achieving both dust resistivity and cooling performance with a simple structure is an important problem.

The present invention, which was made in view of the above-described back ground, aims at providing an electronic apparatus with a simple structure that has a circuit unit housed in a sealed casing that prevents dust from entering therein and that can efficiently cool the circuit unit, and also aims at providing a method of cooling the electronic apparatus.

One embodiment provides an electronic apparatus comprising: a housing that forms a sealed inner space; a circuit unit that is provided in the inner space; a first partition plate that is provided in the inner space and that has an upper/lower partition portion, wherein the upper/lower partition portion at least partially extends in a lateral direction above at least a part of the circuit unit and that terminates in front of both lateral sides of the housing; and a first fan provided through the upper/lower partition portion.

Another embodiment provides a method of cooling an electronic apparatus, the apparatus including a housing that forms a sealed inner space and including a circuit unit provided in the inner space, the method comprising causing a circulating air flow in the inner space by: feeding the air in the inner space from a side of a lower surface of an upper/lower partition portion to a side of an upper surface of the upper/lower partition portion through an opening provided on the upper/lower partition portion, wherein the upper/lower partition portion is provided in the inner space and extends horizontally in the inner space such that at least a part of the circuit unit is separated from an upper space of the upper/lower partition portion; guiding the air along the upper surface of the upper/lower partition portion toward side surfaces of the housing, the air being fed to the side of the upper surface of the upper/lower partition portion; cooling the air while guiding the air in a downward direction along the side surfaces of the housing, the air reaching the side surfaces of the housing; and guiding the cooled air in an upward direction toward the opening.

A further embodiment provides a method of cooling an electronic apparatus having the same configuration. The method comprises causing a circulating air flow in the inner space by: feeding the air in the inner space from a side of an upper surface of an upper/lower partition portion to a side of a lower surface of the upper/lower partition portion through an opening provided on the upper/lower partition portion, wherein the upper/lower partition portion is provided in the inner space and extends horizontally in the inner space such that at least a part of the circuit unit is separated from an upper space of the upper/lower partition portion; guiding the air toward lower portions of side surfaces of the housing, the air being fed to the side of the lower surface of the upper/lower partition; and cooling the air while guiding the air in an upward direction along the side surfaces of the housing, the air reaching the lower portions of the side surfaces of the housing.

According to the present invention, it is possible to provide an electronic apparatus with a simple structure that has a circuit unit housed in a sealed casing that prevents dust from entering therein and that can efficiently cool the circuit unit, and also to provide a method of cooling the electronic apparatus.

Figure 1:
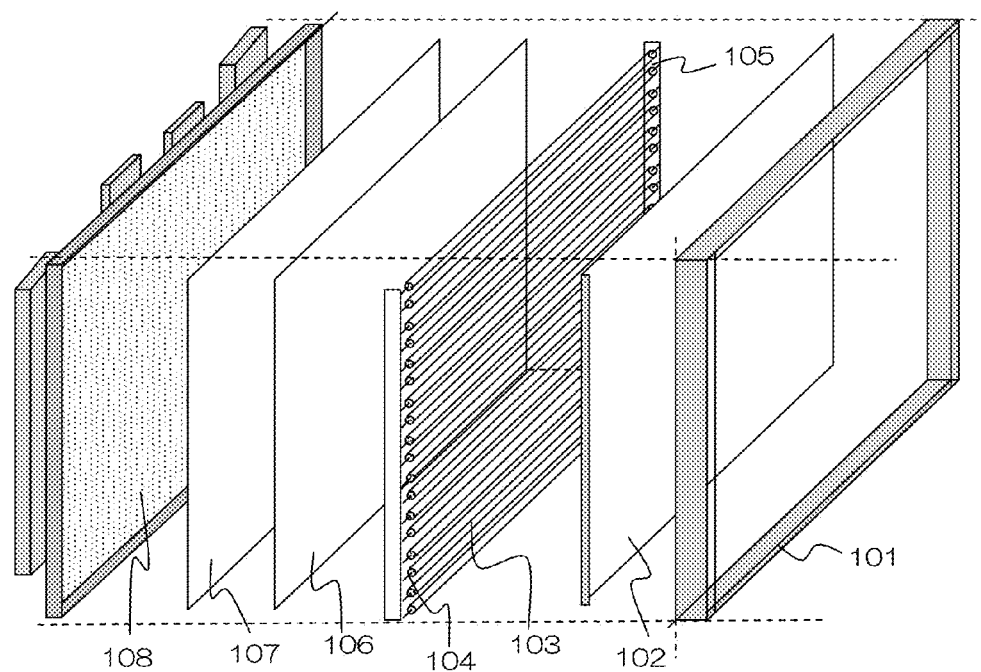
FIG. 1 is a sectional view showing the inner structure of an image display apparatus relating to the present invention.

DESCRIPTION OF SYMBOLS 1 liquid crystal display apparatus
2 liquid crystal image display unit
5 fan
6 fan
7 upper/lower partition portion
8 vertical extension
9 inverter circuit unit
10 computer unit
11 control board
12 power supply unit
13 voice controller
17 air flow adjusting plate
31 housing
32 casing
33 inner space
34 first partition plate
35 end
36 through hole
37 upper space
38 side space
39 circuit unit
40 second partition plate

BEST MODE FOR CARRYING OUT THE INVENTION

An electronic apparatus and an image display apparatus according to the present invention will be described with reference to the drawings. The present invention will be described referring to the example of a sealed large liquid crystal display apparatus. However, the present invention is not limited to the example and can be applied to a plasma display apparatus, a CRT (Cathode Ray Tube) image display apparatus or the like in a similar manner. Further, the present invention can be widely applied to sealed electronic apparatuses other than the image display apparatus.

First Embodiment

Figure 2A:
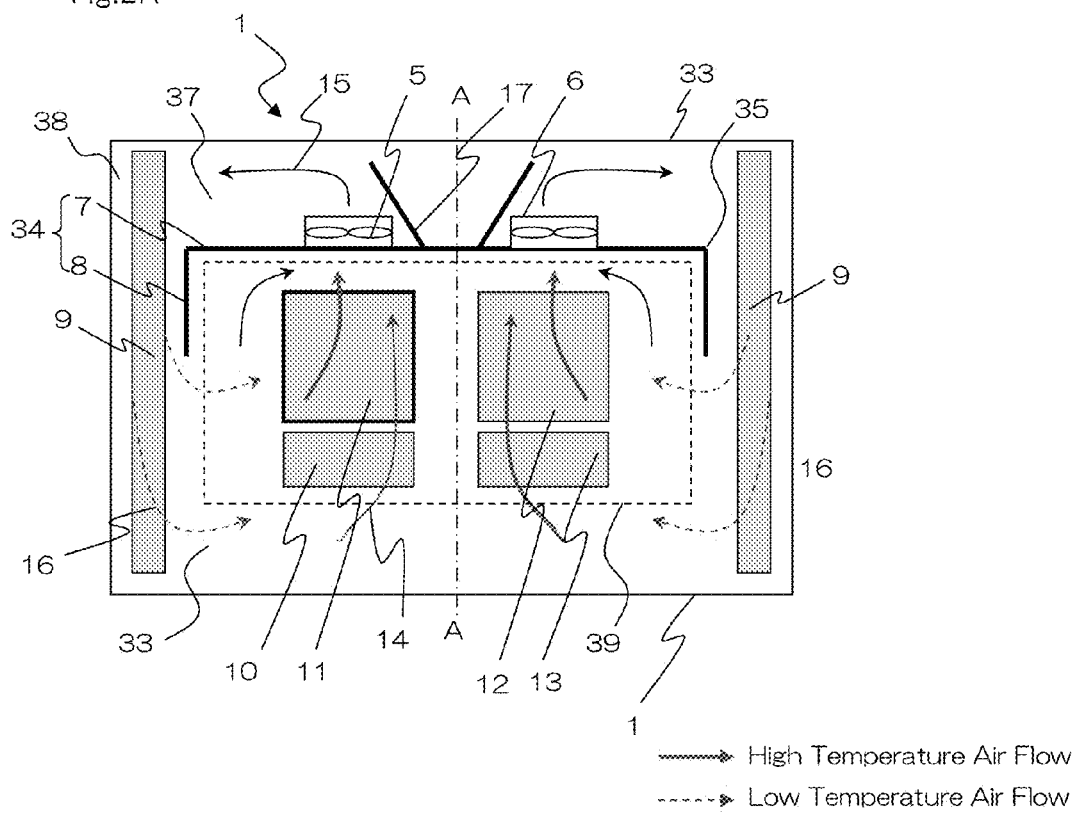
FIG. 2A is a sectional view (sectional view seen from the back side) showing the inner structure of an image display apparatus according to a first embodiment.
Figure 2B:
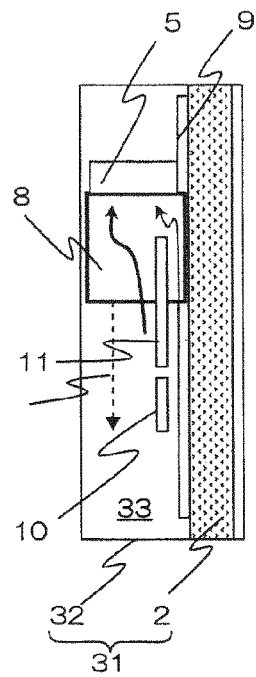
FIG. 2B is a sectional view (side sectional view taken along the line A-A in FIG. 2A) showing the inner structure of the image display apparatus according to the first embodiment.
Figure 3:
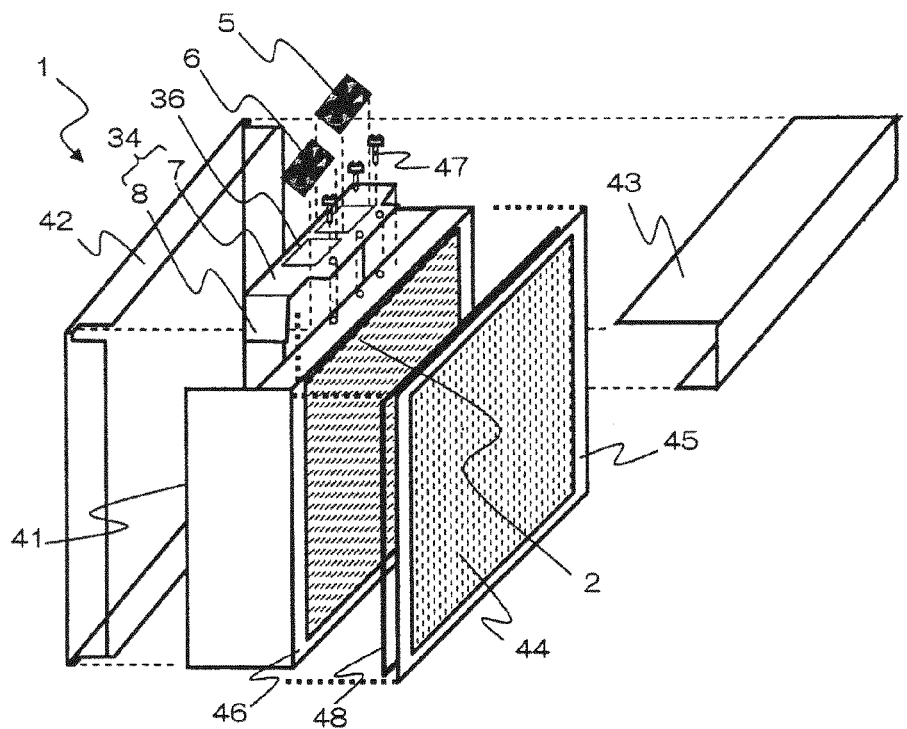
FIG. 3 is a conceptual exploded perspective view of the image display apparatus shown in FIG. 1.

FIGS. 2A and 2B are sectional views showing the inner structure of an image display apparatus according to an embodiment, wherein FIG. 2A is a sectional view seen from the back side and FIG. 2B is a side sectional view taken along the line A-A in FIG. 2A. FIG. 3 is a conceptual exploded perspective view of the image display apparatus shown in FIGS. 2A and 2B.

Referring to the drawings, image display apparatus 1 includes housing 31 that forms sealed inner space 33 and circuit unit 39 provided in inner space 33. Housing 31 includes image display unit (display panel) 2 placed on the front side of the apparatus and casing 32 that forms a sealed container together with image display unit 2. Casing 32 consists of central casing portion 41, back plate 42 and top plate 43. Non-reflective transparent plate 44 is provided in front of the front surface of display panel 2. Plate 44 is fixed along its periphery by means of fitting 45, with dust-proof sheet 48 interposed between plate 44 and image display unit 2.

Circuit unit 39, which makes image display unit 2 display images thereon, includes computer unit 10 provided in the center of the apparatus, control board 11 for controlling the liquid crystal display unit, power supply unit 12 that supplies power to the image display apparatus, voice controller 13 and so on. In addition, inverters 9 that supply power to a backlight are provided on the left and right sides of the apparatus.

First partition plate 34 is provided in the upper part of inner space 33. First partition plate 34 includes upper/lower partition portion 7. Upper/lower partition portion 7 extends horizontally, that is, upper/lower partition portion 7 laterally extends above computer unit 10, control board 11, power supply unit 12 and voice controller 13, terminating in front of both side portions of casing 32. First partition plate 34 includes a pair of vertical extensions 8 that extend downward in the vertical direction from ends 35 of upper/lower partition portion 7 positioned on both sides of the casing 32. As a result, first partition plate 34 is provided in the form of a square U-shape above computer unit 10, control board 11, power supply unit 12 and voice controller 13, all of which are heat generating components, and forms upper space 37 partitioned by first partition plate 34. Vertical extensions 8 may be omitted depending on required cooling performance. The arrangement of circuit unit 39 is an example, and either one or more among computer unit 10, control board 11, power supply unit 12 and voice controller 13 may be placed above first partition plate 34, depending on the arrangement of the circuit unit.

First partition plate 34 is secured to the upper surface of image display unit 2. Specifically, first partition plate 34 is secured to chassis 46 of image display unit 2 by means of securing screws 47. First partition plate 34 extends from the back surface of image display unit 2 to back plate 42 in the front/back direction of the apparatus.

Upper/lower partition portion 7 has openings 36, at which a pair of fans 5, 6 is provided through upper/lower partition portion 7. Fans 5, 6 are secured to upper/lower partition portion 7. Fans 5, 6 suck air from below upper/lower partition portion 7 and exhaust the air above upper/lower partition portion 7, thereby generating a flow of air that circulates in upper space 37 that is partitioned by upper/lower partition portion 7. Fans 5, 6 are located above control board 11 and power supply unit 12, respectively, seen in the vertical direction. Two fans are provided in the present embodiment, but one or three or more fans may be provided, depending on required cooling performance.

Upper/lower partition portion 7 has air flow adjusting plates 17 thereon, located near fans 5, 6 and closer to the center of the apparatus than fans 5, 6, seen in the horizontal direction. Air flow adjusting plates 17 are inclined toward fans 5, 6, for example, at an angle of 45°.

FIGS. 2A and 2B conceptually show the airflow in the image display apparatus of the present embodiment. The air, which is heated by heat generated in circuit unit 39 in the center of the apparatus, such as computer unit 10, control board 11, power supply unit 12 and voice controller 13, is sucked by fans 5, 6, and is then exhausted into upper space 37 through upper/lower partition portion 7. The hot air exhausted into upper space 37 branches in the leftward and rightward directions (horizontal branch flow 15), then flows downward in side spaces 38 between vertical extensions 8 and casing 32 (downward flow 16), then reaches the lower portion of inner space 33, and then flows into circuit unit 39 in the center of the apparatus again in the form of upward flow 14. Heat that the air received mainly in circuit unit 39 is dissipated to the outside via the outer walls of casing 32. The air flows substantially in the form of a square U-shape along the outer walls of casing 32, allowing efficient heat exchange with the outside via the outer walls of casing 32.

According to the present embodiment, a stirring and cooling effect is achieved by fans 5, 6 and by first partition plate 34 that controls the flow of the cooling air. The specific structure of first partition plate 34 allows a maximum and efficient circulation of the air flow, but not as a ventilation path that is generally used and that connects a heat receiving portion and a heat source. According to the efficient cooling manner in the present embodiment, the components can be cooled, i.e., heat is dissipated (exhausted to the outside of the apparatus) while the temperature of the components is kept below the temperature requirement, with a reduced number of fans and with reduced power consumption. In the general cooling method, a fan is provided near a heat generating component; the component is cooled by air having high velocity; and the heated air is exhausted from an exhaust port of the apparatus. On the other hand, the present embodiment requires a heat exhaust technique that does not rely on exhausting air to the outside because no exhaust port is provided due to the sealed structure. For that purpose, heat is moved to the casing surface by the stirring effect, and is then dissipated using heat conduction via the casing surface in the present embodiment. Thus, cooling on the outer surface of the casing relies on natural convection. According to the present embodiment, efficient heat dissipation using a broader area of the casing surface is possible due to such stirring effect.

According to the present embodiment, fans 5, 6 generate a circulating air flow that is effective for thermal diffusion and that maximizes the stirring effect. According to the present embodiment, downward flow 16 having the lowest temperature after releasing heat returns to computer unit 10, control board 11, power supply unit 12 and voice controller 13. Therefore, there is no need for providing individual measures against heat in circuit unit 39.

Because of the downward squared U-shape of first partition plate 34, first partition plate 34 does not cause hot stagnation points in upper space 37 when combined with upward fans 5, 6. Hot stagnating air not only prevents cooling of circuit unit 39 but also causes a temperature difference between the upper and the lower portions in inner space 33 of the apparatus, which may affect image quality of the liquid crystal panel. According to the present embodiment, heat generated in circuit unit 39 is collected at the fan inlet, and horizontal branch flow 15 that has a high flow rate is formed in upper space 37 which is on the side of the fan exit. In this manner, a structure that does not cause hot stagnation points can be established.

The air that is released to upper space 37 flows toward the left and right sides of the apparatus in the form of horizontal branch flow 15. Air flow adjusting plates 17 direct the airflow in the left and right direction while limiting pressure loss, and further enhance the cooling effect.

According to the liquid crystal display apparatus of the present embodiment, inverters 9 for the backlight are provided on the left and right sides of the apparatus, as seen in many liquid crystal display apparatuses. The air passing through inverters 9 is maintained at high velocity because of vertical extensions 8 of first partition plate 34. Thus, inverters 9 can be efficiently cooled. Although inverters 9 almost extend to the lower end of inner space 33, it is preferable to cool the entire apparatus that vertical extensions 8 terminate halfway in the height of inner space 33 rather than to extend extensions 8 to the lower end.

According to the cooling structure of the present embodiment, first partition plate 34 generates circulating flow in the apparatus so that the heat generated in circuit unit 39 is diffused over the entire apparatus and heat dissipation is promoted. As compared with a conventional cooling method, the present embodiment achieves efficient cooling even with a small air temperature difference and achieves an improvement in the heat dissipation characteristics of the sealed container. In the case of an image display apparatus, it is impossible to cool the apparatus via the front surface of the apparatus because it is the image displaying surface. However, the apparatus in the present embodiment can be cooled with heat dissipation via the back side thereof which has a large area. Further, heat generating components are usually mounted adjacent to the back surface of the image display unit in the image display apparatuses. According to the present embodiment, the generated heat can be moved from the side of the display unit to the back side of the apparatus by effective circulation of the air flow. Further, due to the structure in which the air flow circulates in the in-plane direction of the apparatus, heat can also be dissipated via the side surfaces, top plate 43 and the bottom surface of casing 32. Thus, heat dissipation using all the surfaces except for the display unit is achieved.

Each electronic component in circuit unit 39 can be efficiently cooled because first partition plate 34 allows maximum use of the air flow from the fans and also because first partition plate 34 minimizes interference with circuit unit 39 due to the simple structure thereof. The simple structure also reduces pressure loss of the circulating air, thereby allowing a large flow rate of the circulating air that is advantageous for cooling.

In the image display apparatus of the present embodiment, all the components mounted are housed in one sealed structure, and a special cooling function for a lamp housing portion is not required, as needed in a conventional apparatus. Thus, it is possible to use ordinary components for the liquid crystal display apparatus without modification and thereby to reduce cost.

Locations and configurations of first partition plate 34 and fans 5, 6 can be optimized so that the components mounted in the apparatus, such as inverter circuit units 9, control board 11 and power supply unit 12, are effectively cooled and cooling performance can be easily improved. For example, the cooling effect can be adjusted for each component by modifying the configuration of first partition plate 34. Such modification brings improvement in efficiency, as well as cost reduction and simplification of installation work. Since first partition plate 34 is formed to cover the entire heat generating area, interference with circuit unit 39 is unlikely to occur. Thus, first partition plate 34 has wide applicability, thereby allowing it to be applied to many kinds of image display apparatuses. As a result, it is possible for many kinds of image display apparatuses to stabilize the temperature of electronic circuit components mounted in the apparatus, to stabilize brightness, which is obtained by operating the fluorescent lamp at a fixed brightness level, and to achieve long life of the liquid crystal panel due to maintaining a uniform temperature.

Figure 4A:
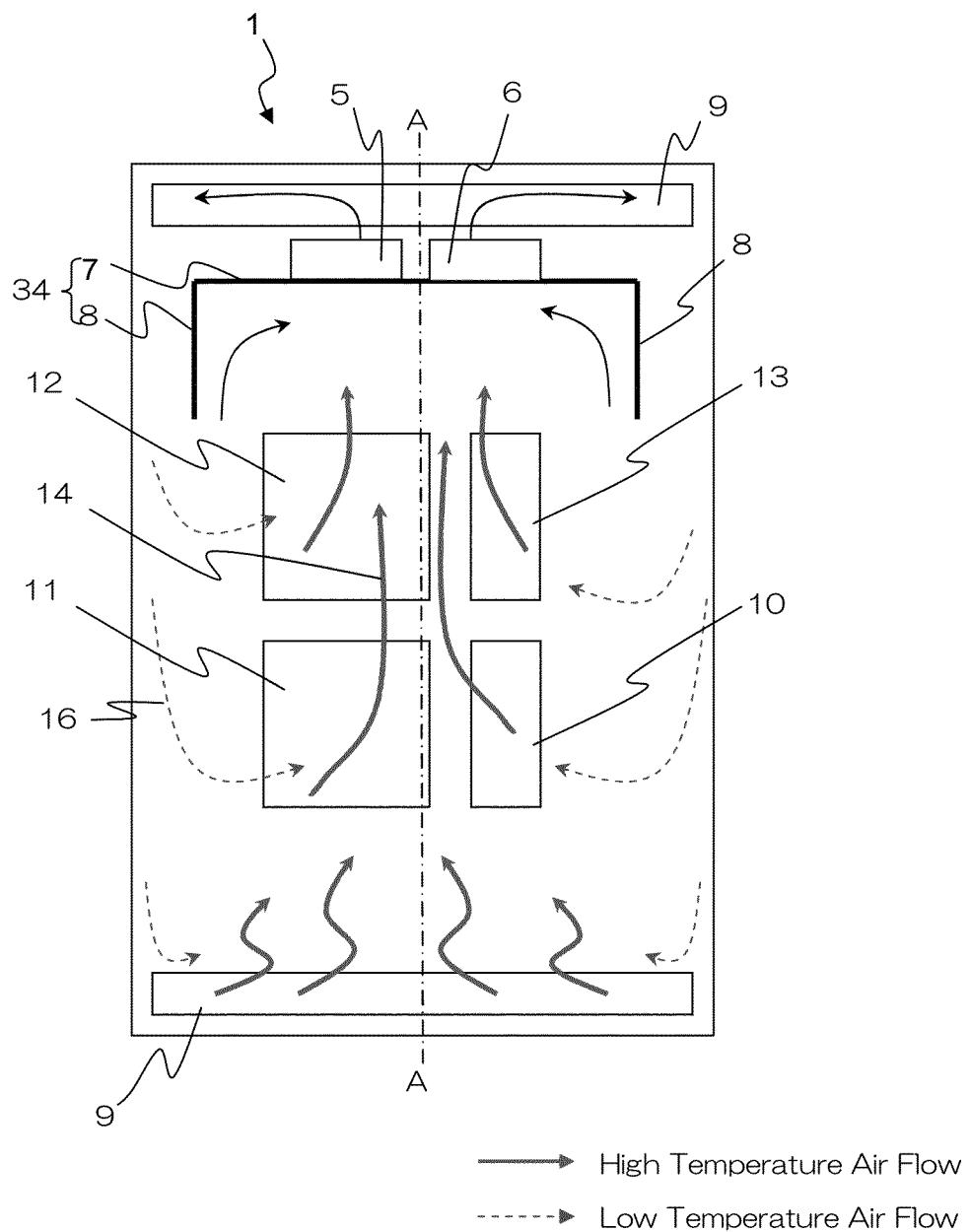
FIG. 4A is a sectional view (sectional view seen from the back side) showing the inner structure of the image display apparatus installed and used in the upright position.
Figure 4B:
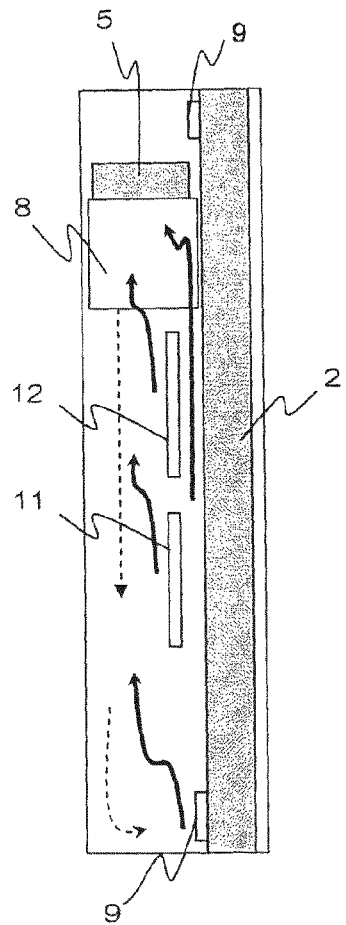
FIG. 4B is a sectional view (side sectional view taken along the line A-A in FIG. 4A) showing the inner structure of the image display apparatus installed and used in the upright position.

The liquid crystal display apparatus of the present embodiment may be installed and used in the upright position. Causing the air flow to circulate is also desirable in this case in order to achieve the stirring and cooling effect, as in the case of the horizontal setting. As shown in FIGS. 4A and 4B, upward flow 14 is preferably caused in the central portion of the liquid crystal display apparatus, and then branches in the leftward and rightward directions as a circulating air flow by means of by fans 5, 6. When the apparatus is used in the upright position, inverters 9 are positioned at the upper and lower ends. In this case, it is relatively difficult to distribute the circulating air flow in the upward and downward directions. However, inverter 9 at the lower end is exposed to the atmosphere of the lowest temperature in the apparatus, and the need for cooling with the circulating air flow is small.

Second Embodiment

In embodiments hereinafter, descriptions will be mainly made on the modifications from the first embodiment. See the description of the first embodiment, unless otherwise specified.

Figure 5:
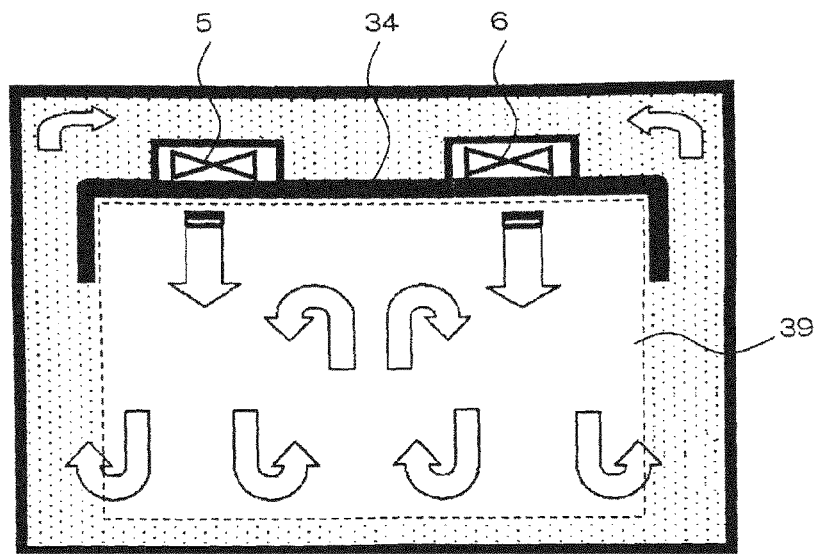
FIG. 5 is a sectional view showing the inner structure of an image display apparatus according to a second embodiment.

FIG. 5 shows a conceptual view of the present embodiment. According to the present embodiment, fans 5, 6 are adapted to suck air from above first partition plate 34 and to exhaust the air toward below first partition plate 34. First partition plate 34 has a structure similar to that in the first embodiment, but the fans are arranged downward so that the circulating air flow shown in FIG. 5 is generated. In this case, the airflow from fans 5, 6 is directed downward along circuit unit 39, such as the control board and the power supply unit, in the liquid crystal display apparatus. Due to the relatively high velocity of the airflow supplied from fans 5, 6, the components in circuit unit 39 can be efficiently cooled.

Third Embodiment

Figure 6:
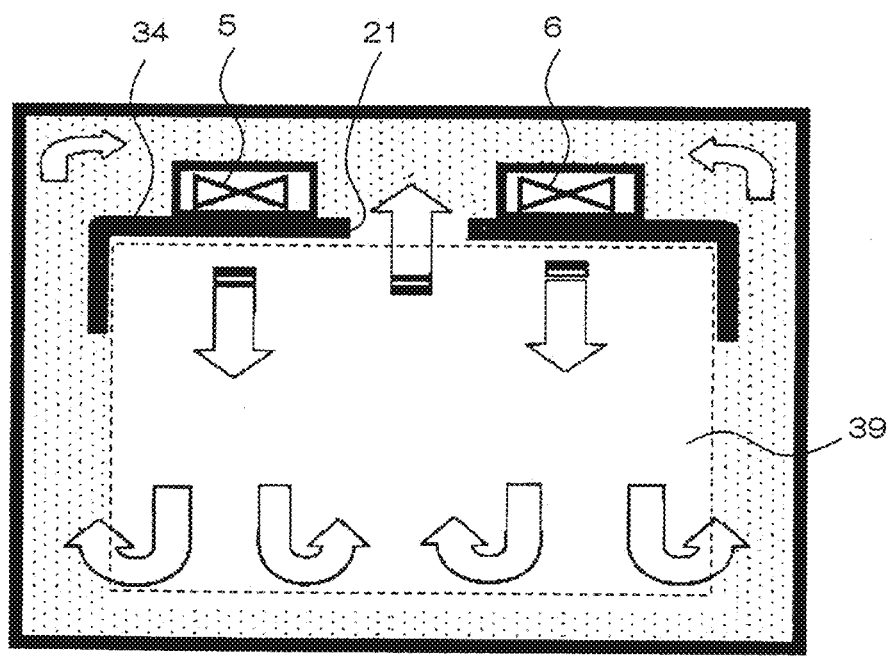
FIG. 6 is a sectional view showing the inner structure of an image display apparatus according to a third embodiment.

FIG. 6 shows a conceptual view of the present embodiment. According to the present embodiment, fans 5, 6 are provided downward similarly to the second embodiment, and in addition, through hole 21 is provided between the pair of fans 5, 6 in first partition plate 34. Such a structure enhances the ventilation effect in the vertical direction within the liquid crystal display apparatus. Since pressure loss of the circulating air is reduced, it is possible to increase the flow rate of the fan and to supply a larger amount of cooling air to circuit unit 39. In this way, the cooling effect of the components is improved.

Fourth Embodiment

Figure 7A:
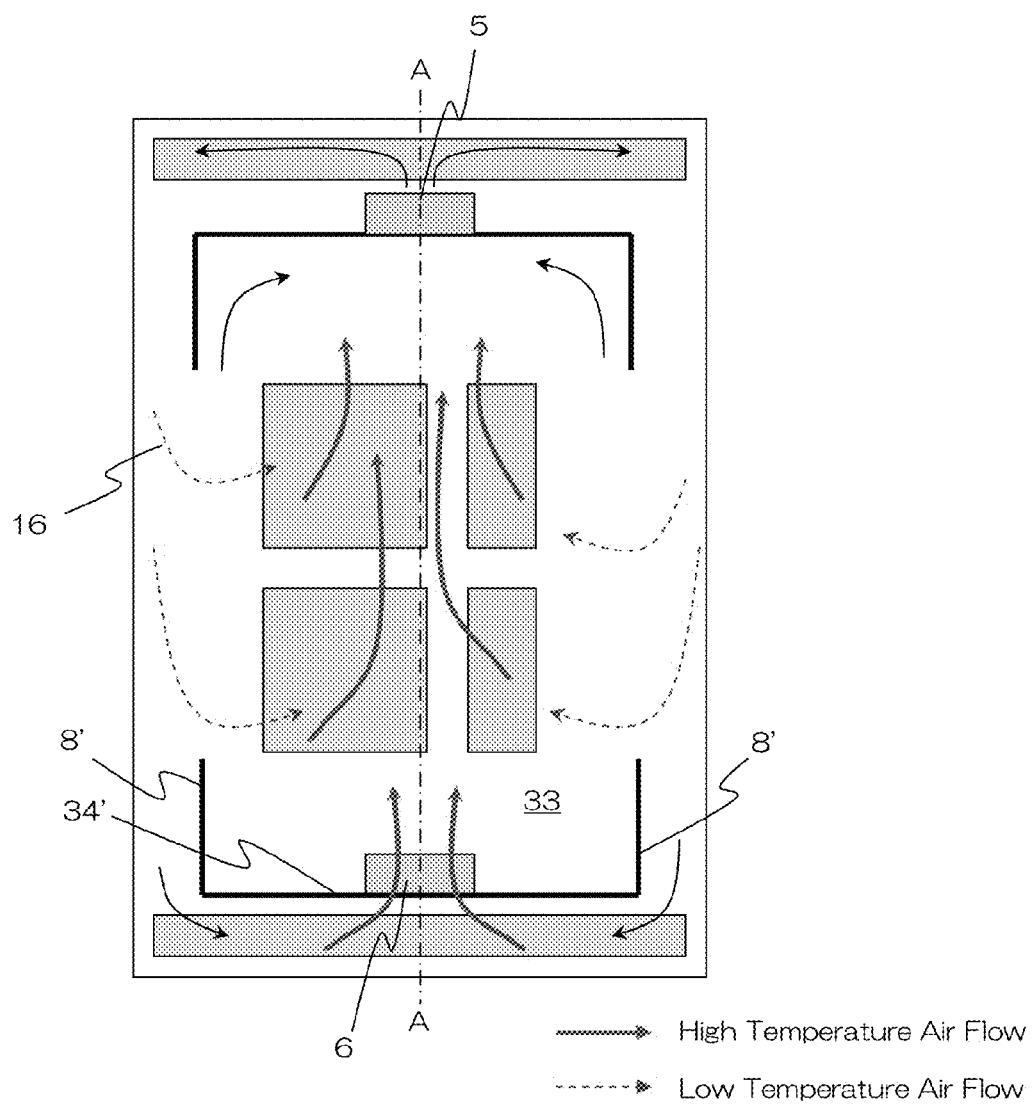
FIG. 7A is a sectional view (sectional view seen from the back side) showing the inner structure of an image display apparatus according to a fourth embodiment.
Figure 7B:
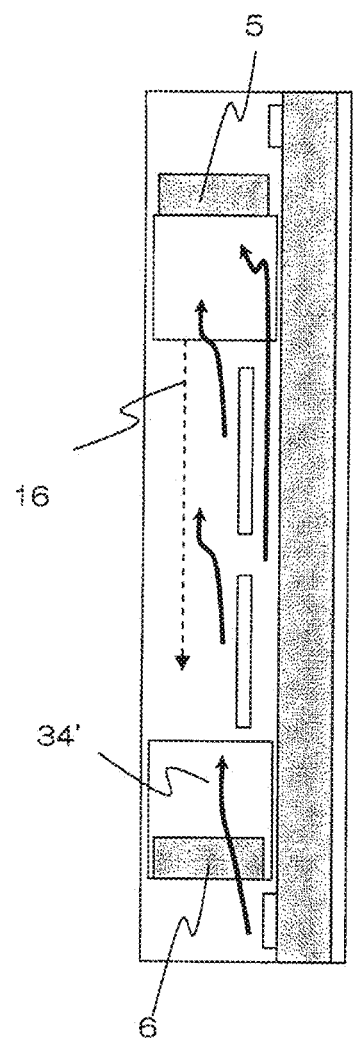
FIG. 7B is a sectional view (side sectional view taken along the line A-A in FIG. 7A) showing the inner structure of the image display apparatus according to the fourth embodiment.

FIGS. 7A and 7B show a conceptual view of the present embodiment. FIG. 7A is a sectional view of an image display apparatus seen from the back side and FIG. 7B is a side sectional view taken along the line A-A in FIG. 7A. This embodiment is preferably applied when a liquid crystal display apparatus is installed and used in the upright position. According to the present embodiment, second partition plate 34' is provided in the lower portion of inner space 33. Second partition plate 34' laterally extends below circuit unit 39 and terminates in front of both sides of casing 32, seen in the horizontal direction. From both side ends of second partition plate 34', vertical extensions 8' extend upwardly in the vertical direction. Fan 5 is provided through first partition plate 34 and fan 6 is provided through second partition plate 34'. When lower inverter 9 is subject to high temperature load, i.e., for example, when the temperature outside the apparatus is high, square U-shaped first and second partition plates 34 and 34' are preferably provided in the upper and lower portions, as shown, for example, in FIG. 7A, so that the circulating air flow is distributed over the entire inside portions of the apparatus. Fan 6 provided on the lower side induces an upward flow that promotes the stiffing effect in the apparatus, as well as a flow that passes through lower inverter 9, which improves the cooling effect of lower inverter 9. Fan 6 is not necessarily required, depending on cooling conditions, because the air that is cooled by the side surfaces or the back surface of the casing has a large specific gravity and naturally becomes a downward flow that enters below inverter 9. On the other hand, depending on cooling conditions, a pair of fans may be provided on first partition plate 34 and on second partition plate 34'. Second partition plate 34' may be located above a part of the components in circuit unit 39 depending on the arrangement of circuit unit 39. Vertical extensions 8' are not required depending on cooling conditions.

Fifth Embodiment

There are some structures for arranging fans that are effective for causing the air flow to circulate in the inner space.

Figure 8A:
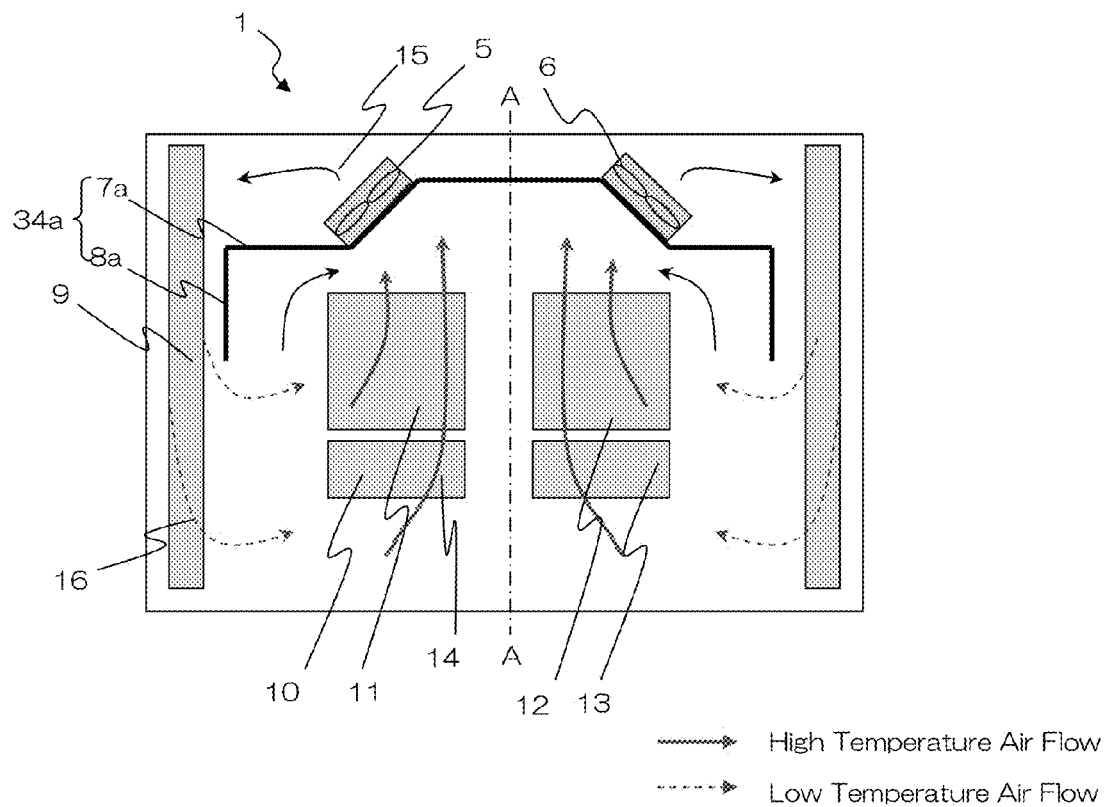
FIG. 8A is a sectional view (sectional view seen from the back side) showing the inner structure of an image display apparatus according to a fifth embodiment.
Figure 8B:
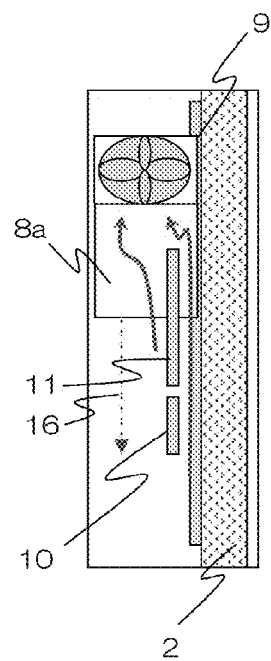
FIG. 8B is a sectional view (side sectional view taken along the line A-A in FIG. 8A) showing the inner structure of the image display apparatus according to the fifth embodiment.
Figure 9:
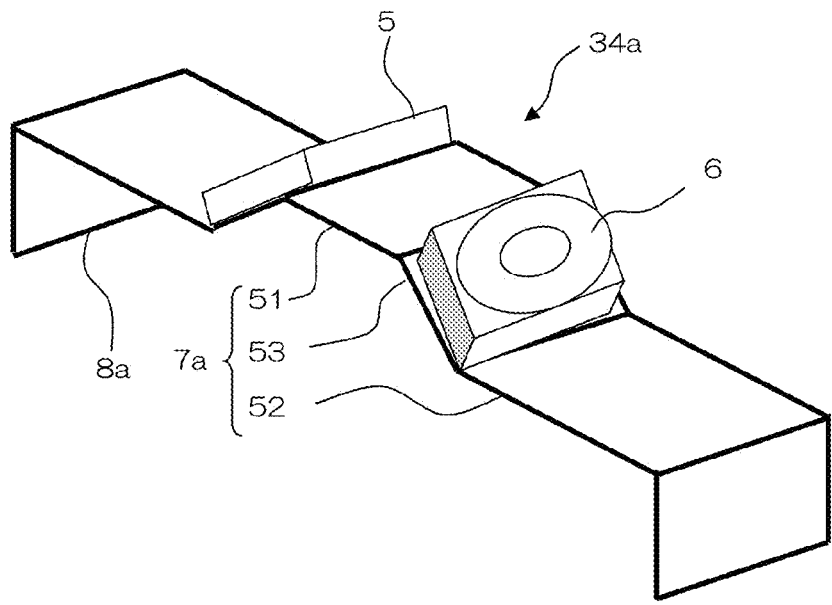
FIG. 9 is a schematic view showing the schematic configuration of the first partition plate and the fans in the embodiment shown in FIGS. 8A and 8B.

FIGS. 8A and 8B show one exemplary embodiment and FIG. 9 shows a schematic configuration of the first partition plate and the fans in the embodiment shown in FIGS. 8A and 8B. FIG. 8A is a sectional view of the image display apparatus seen from the back side and FIG. 8B is a side sectional view taken along the line A-A in FIG. 8A. A pair of fans 5, 6 is provided on upper/lower partition portion 7a of first partition plate 34a. Upper/lower partition portion 7a includes laterally extending central portion 51, a pair of both side portions 52 laterally extending in a position lower than central portion 51 and a pair of inclined portions 53 connecting central portion 51 and the pair of both side portions 52. The pair of fans is provided through upper/lower partition portion 7a at the pair of inclined portions 53. According to the present embodiment, inclined portions 53, or the installing surfaces of the fans, are inclined at an angle of 45°, but the inclination angle can be selected as needed. By inclining the installation surfaces of the fans, it is possible to change the direction of the airflow without using the air flow adjusting plates, while reducing pressure loss.

Figure 10A:
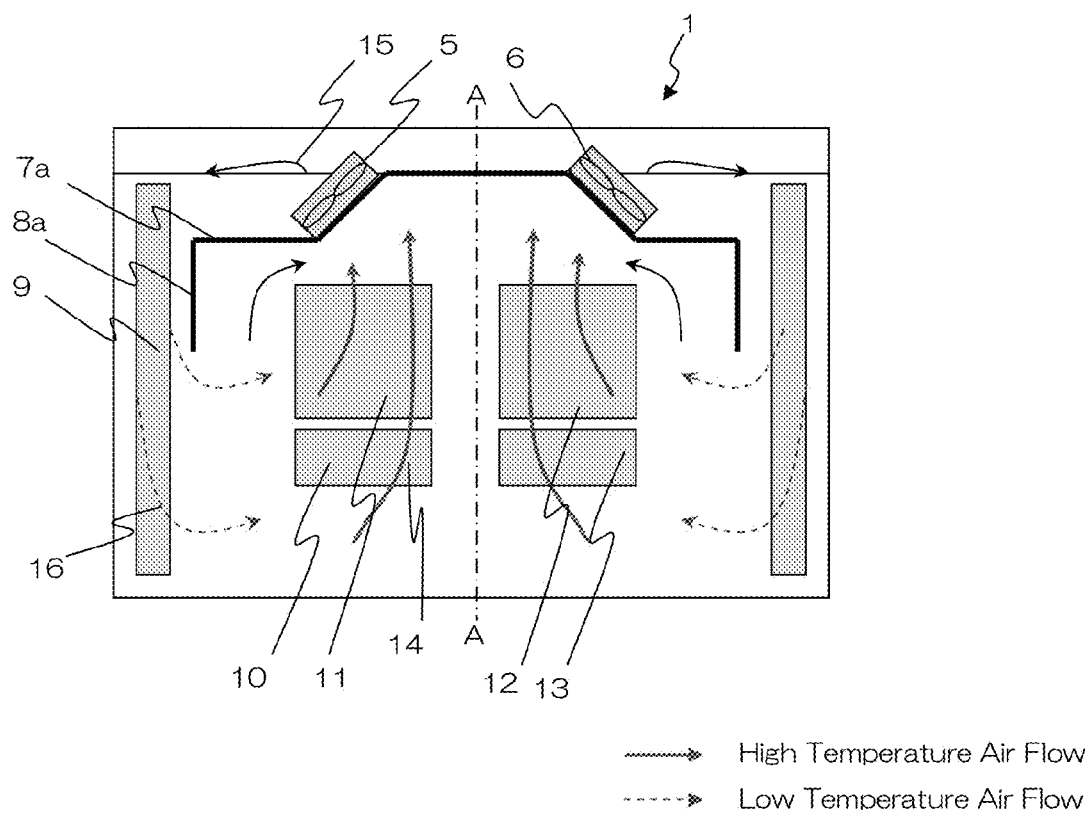
FIG. 10A is a sectional view (sectional view seen from the back side) showing the inner structure of an image display apparatus according to a variation of the embodiment shown in FIGS. 8A and 8B.
Figure 10B:
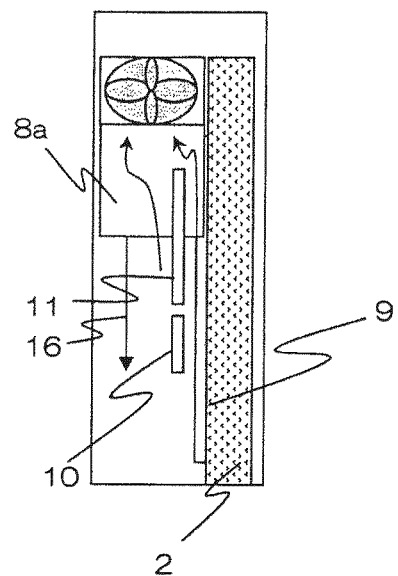
FIG. 10B is a sectional view (side sectional view taken along the line A-A in FIG. 10A) showing the inner structure of the image display apparatus according to the variation of the embodiment shown in FIGS. 8A and 8B.

When casing 32 has a larger height than image display unit 2, the upper end surface of image display unit 2 may be used as a part of the partition plate, as shown in FIGS. 10A and 10B. FIG. 10A is a sectional view of an image display apparatus seen from the back side and FIG. 10B is a side sectional view taken along the line A-A in FIG. 10A. In this embodiment, heat above upper image display unit 2 can be also removed.

Sixth Embodiment

Figure 11:
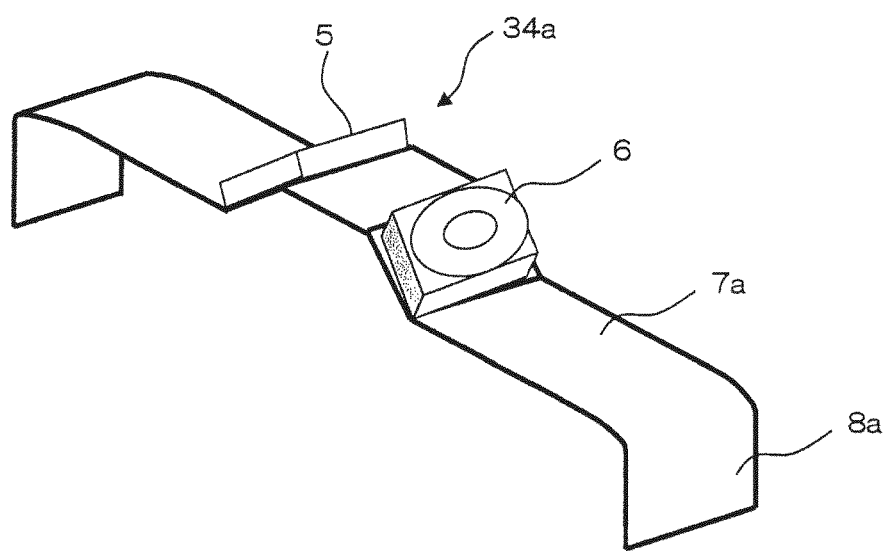
FIG. 11 is a schematic view of the first partition plate of an image display apparatus according to a sixth embodiment.

FIG. 11 shows a variation of the first partition plate shown in FIG. 9. The connection between upper/lower partition portion 7a and vertical extension 8a has a curved configuration. In order to minimize pressure loss of the circulating air flow, it is desirable to avoid a sharp bend in the channel as much as possible. A bend with a right angle produces high pressure loss, but first partition plate 34a with a curved bend, as shown in FIG. 11, reduces pressure loss. This embodiment can be combined with the first and second partition plates in all the embodiments except for the fifth embodiment.

Seventh Embodiment

Figure 12A:
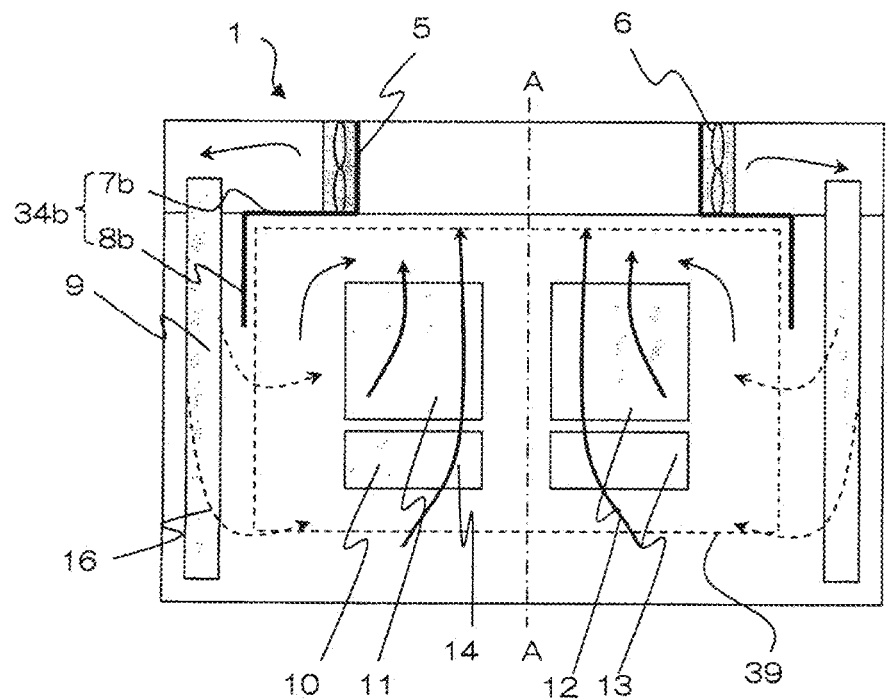
FIG. 12A is a sectional view (sectional view seen from the back side) showing the inner structure of an image display apparatus according to a seventh embodiment.
Figure 12B:
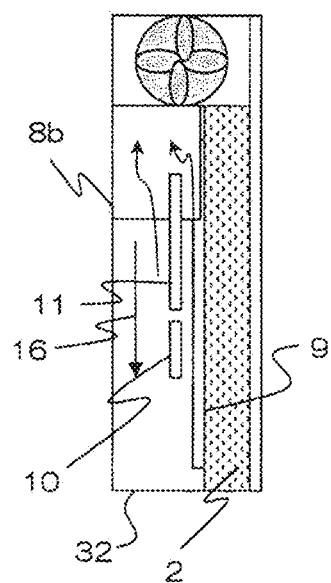
FIG. 12B is a sectional view (side sectional view taken along the line A-A in FIG. 12A) showing the inner structure of the image display apparatus according to the seventh embodiment.
Figure 13:
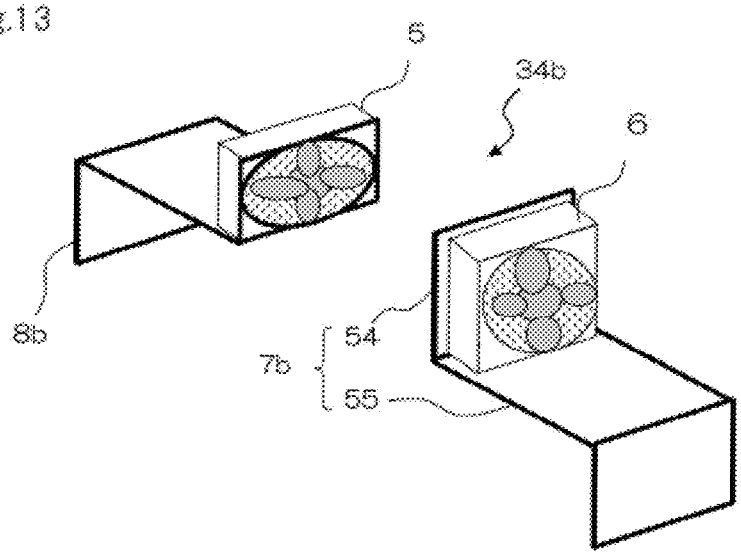
FIG. 13 a schematic view showing the schematic configuration of the first partition plate and the fans in the embodiment shown in FIGS. 12A and 12B.

FIGS. 12A and 12B show conceptual views of the present embodiment. FIG. 13 show a schematic configuration of the first partition plate and the fans in the embodiment shown in FIGS. 12A and 12B. FIG. 12A is a sectional view of the image display apparatus seen from the back side, and FIG. 12B is a side sectional view taken along the line A-A in FIG. 12A. A pair of fans 5, 6 is provided. Upper/lower partition portions 7b of first partition plate 34b include a pair of vertical portions 54 extending vertically downward from the upper surface of casing 32 and a pair of side portions 55 laterally extending from the lower ends of vertical portions 54 toward both sides of casing 32. The pair of fans 5, 6 is provided through upper/lower partition portion 7b at the pair of vertical portions 54. Due to the arrangement in which fans 5, 6 are provided facing each other, space for circuit unit 39 is also ensured in the upper portion of the apparatus. Further, when casing 32 has a larger height than image display unit 2, as shown in the figures, it is possible to arrange fans 5, 6 above image display unit 2 and to reduce the total thickness of image display apparatus 1.

Example

Figure 14A:
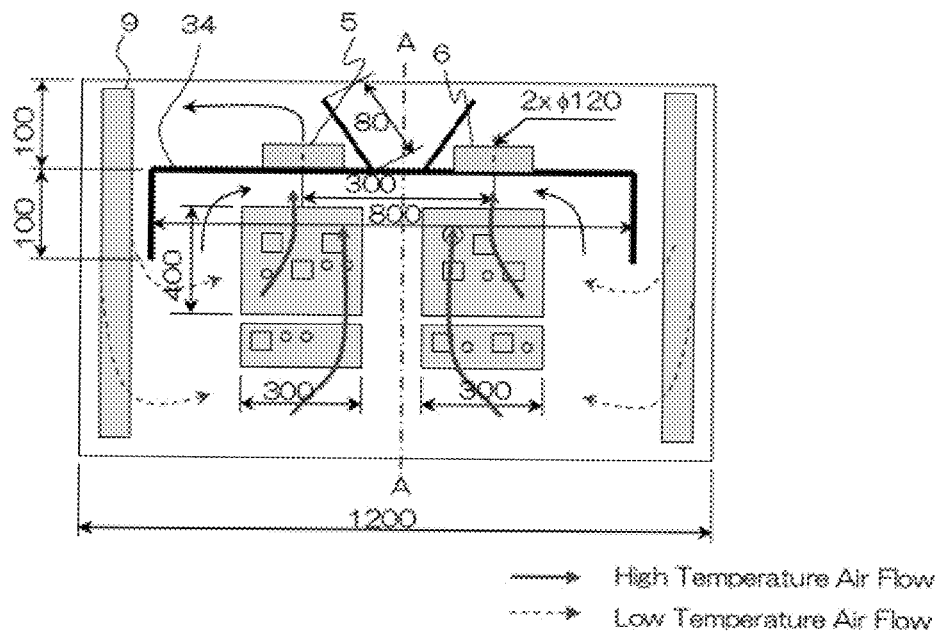
FIG. 14A is a sectional view (sectional view seen from the back side) showing the inner structure of an image display apparatus according to an embodiment.
Figure 14B:
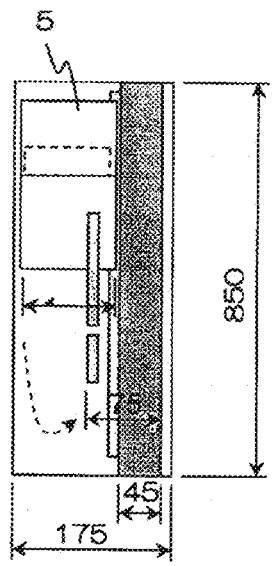
FIG. 14B is a sectional view (side sectional view taken along the line A-A in FIG. 14A) showing the inner structure of the image display apparatus according to the embodiment.
Figure 15:
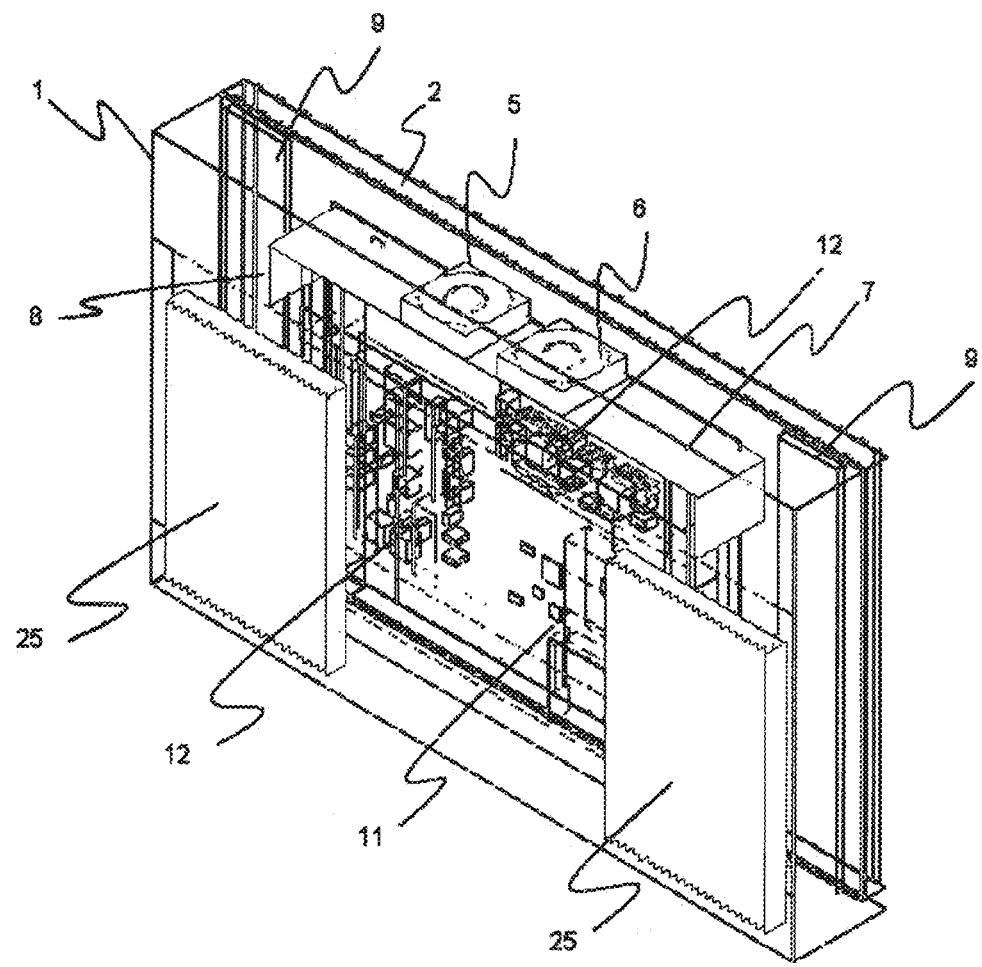
FIG. 15 is a perspective view seen from the back side of the image display apparatus shown in FIGS. 14A and 14B.

Now, an example is shown in which the present invention is applied to a relatively large, sealed type 52-inch liquid crystal display apparatus for use in public places. The 52-inch liquid crystal image display unit has a height of about 650 mm and a width of about 1150 mm The liquid crystal image display unit has a thickness of about 45 mm including the panel, the backlight and so on. FIGS. 14A and 14B are sectional views of the liquid crystal display apparatus in which the liquid crystal image display unit is incorporated into a sealed casing, and FIG. 15 is a perspective view seen from the back side. FIG. 14A is a sectional view of the image display apparatus seen from the back side, and FIG. 14B is a side sectional view taken along the line A-A in FIG. 14A.

Referring to these drawings, fans 5, 6 are provided immediately above control board 11 and power supply board (power supply unit) 12, provided on the back side of the liquid crystal image display unit, respectively. These boards, each having a width of 300 mm, are positioned near the center of the apparatus. In correspondence to this, fans 5, 6 are provided with a distance of 220 mm between the centers thereof. Fans 5, 6 not only suck heat from heat generating components but also force the air that may stagnate above squared U-shaped first partition plate 34 to circulate, and thereby prevent buildup of heat in the apparatus. The heated air passes through fans 5, 6 and flows toward the left and right areas of the apparatus. In the meantime, the heated air is stirred in the front/back direction of the apparatus and its temperature is reduced. Thus, a cooling effect of inverters 9 can be obtained. The airflow is directed downward along the left and right sides of the apparatus, while being stirred, and returned to the center of the apparatus. This airflow exhausts heat to the outside through the left, right and back walls of the apparatus which are at a low temperature.

Figure 16A:
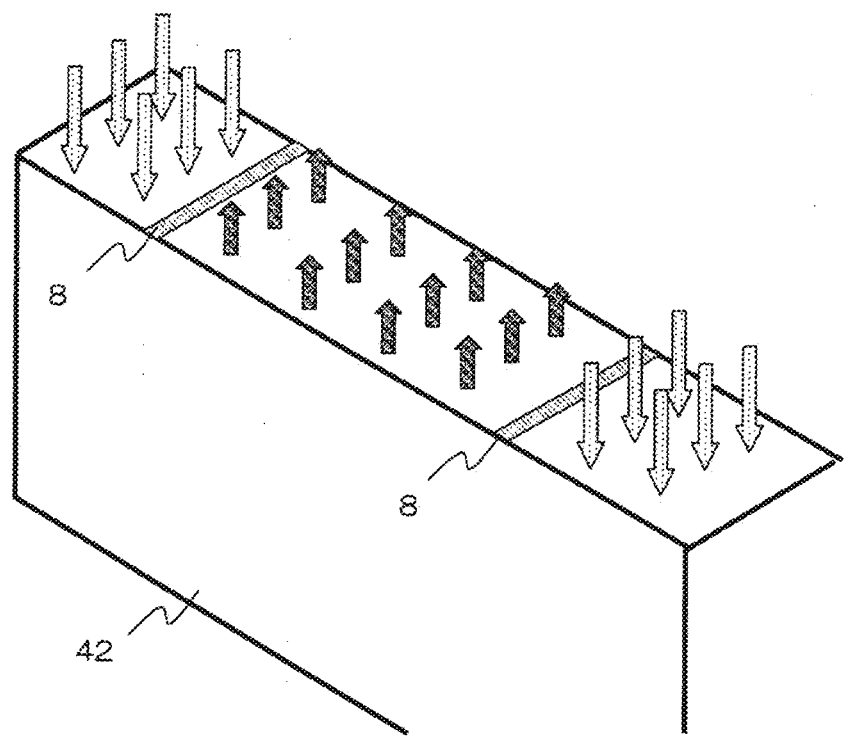
FIG. 16A is a schematic view illustrating an effect of the embodiment.
Figure 16B:
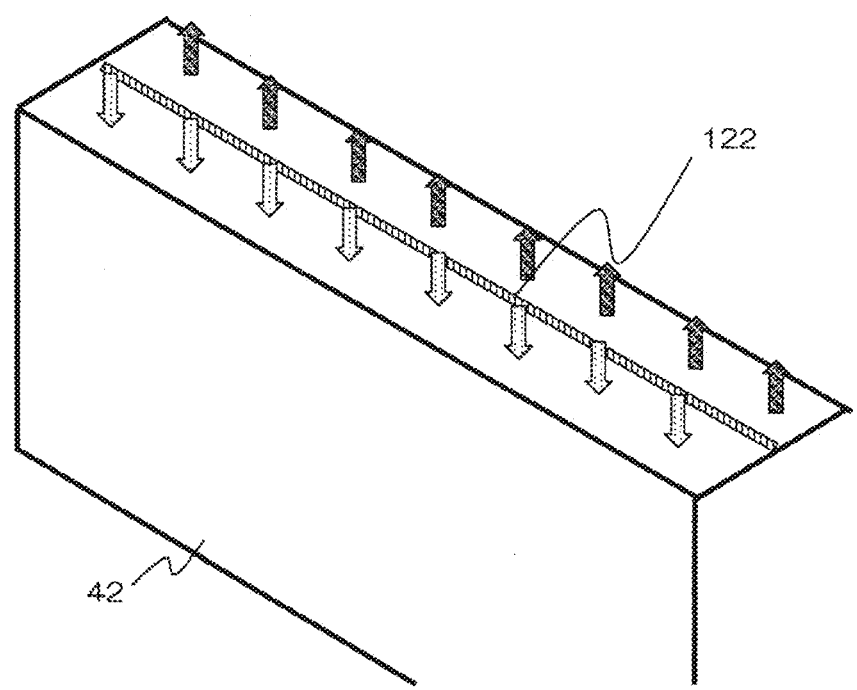
FIG. 16B is a schematic view illustrating an effect of the embodiment.

Fins 25 are formed on the back surface to provide a heat dissipating effect via natural convection. Fins 25 may also be provided on the side surfaces in addition to the back surface. Fins 25 enhance heat dissipating efficiency on the back surface and the side surfaces in a significantly effective manner. The heat generated on the front side of the liquid crystal panel is dissipated on the back side by the stirring effect in the front/back direction. As shown in FIG. 16A, the circulating air flow in this example is induced such that the air circulates in an in-plane direction in the apparatus. It is also possible to form partition plate 122 that divides the space in the front/back direction, as shown in FIG. 16B. However, this arrangement is not preferable because it produces high pressure loss due to the flat configuration of the channel and a large aspect ratio thereof.

Figure 17:
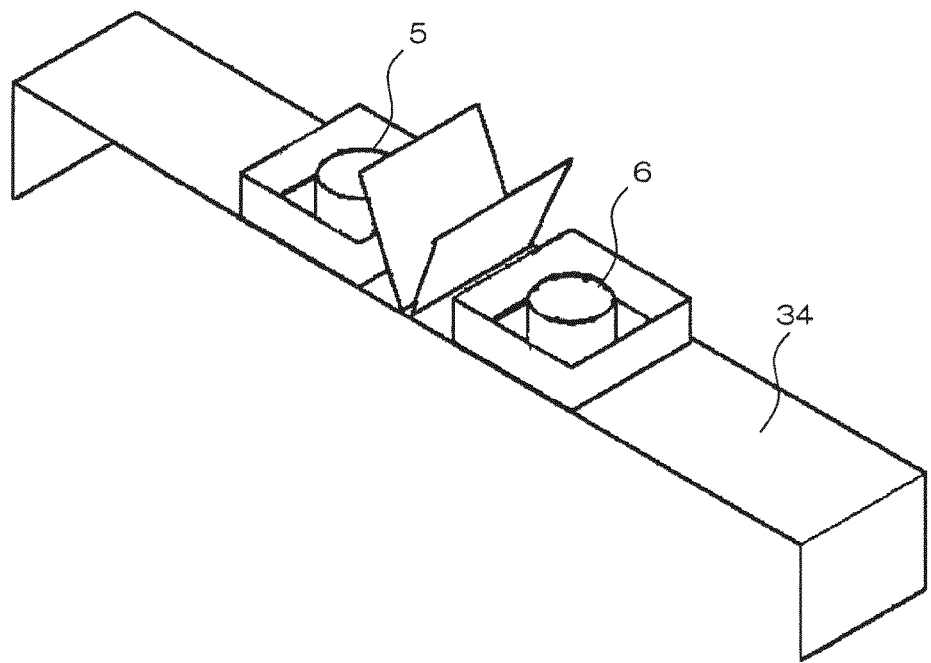
FIG. 17 is a schematic view showing an example of the distance between the fans.
Figure 18:
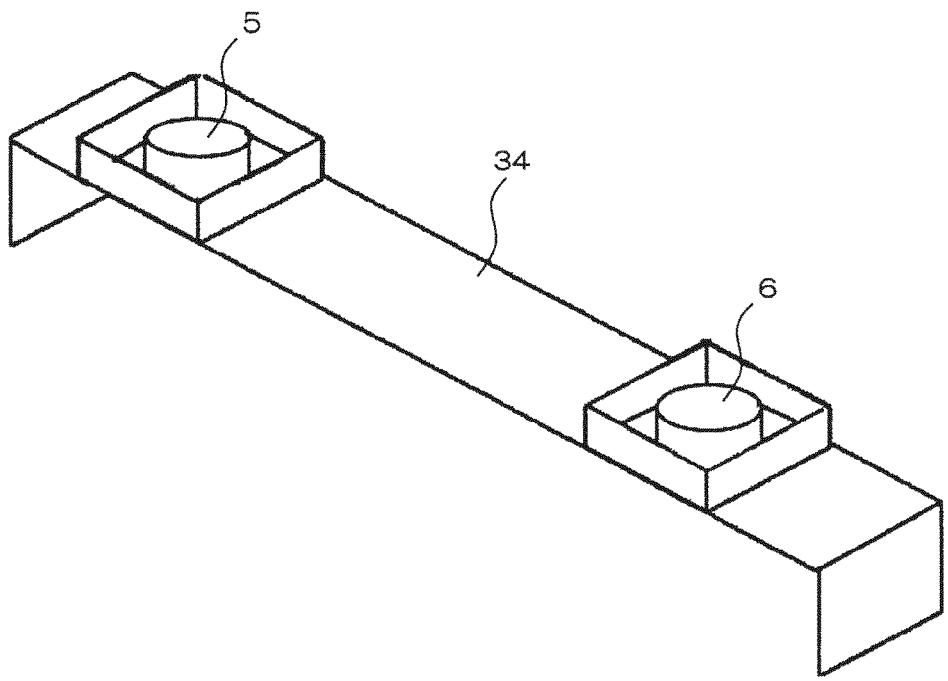
FIG. 18 is a schematic view showing an example of the distance between the fans.
Figure 19:
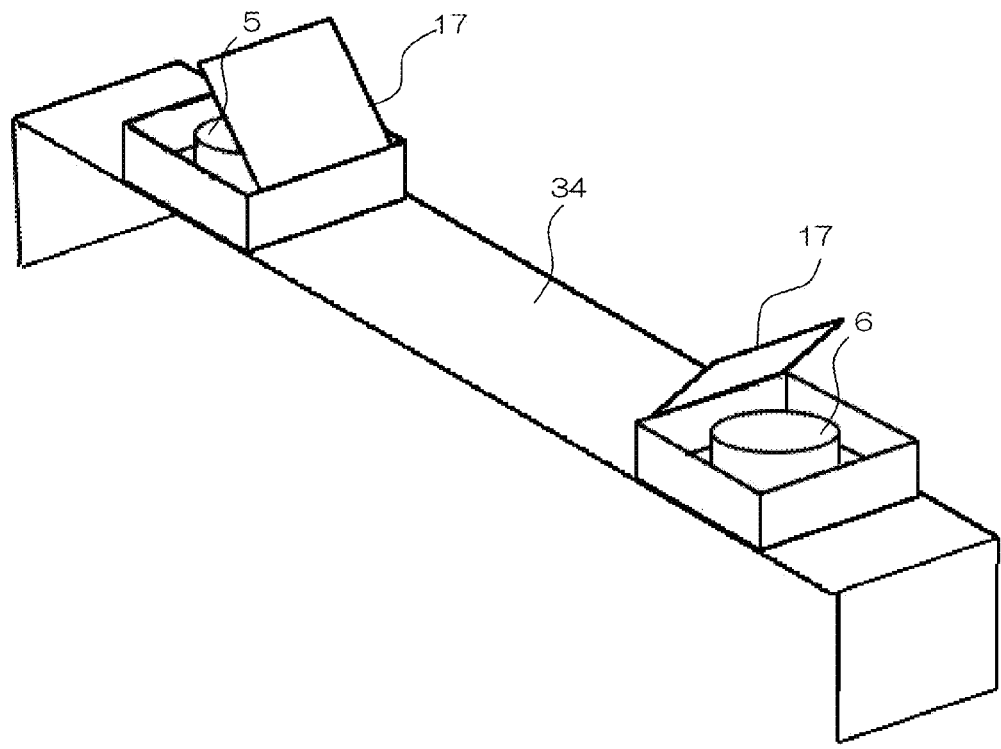
FIG. 19 is a schematic view showing an example of the distance between the fans and the air flow adjusting plates.

In the present example, fans 5, 6 are provided at a small distance on first partition plate 34 that laterally extends, as shown in FIG. 17. However, the distance between two fans 5, 6 may be preferably changed depending on the size and the position of the boards that are arranged below and that have the generating components mounted thereon. For example, the distance between the fans may be preferably as large as about 500 mm, as shown in FIG. 18, so that the circulating length is shortened and a high flow rate is obtained in the left and right areas in the apparatus. Since the air tends to flow into the area between the fans in the upper area of first partition plate 34, it is also preferable to provide air flow adjusting plates 17 to direct airflow toward the left and right ends of the apparatus, as shown in FIG. 19.

Figure 20:
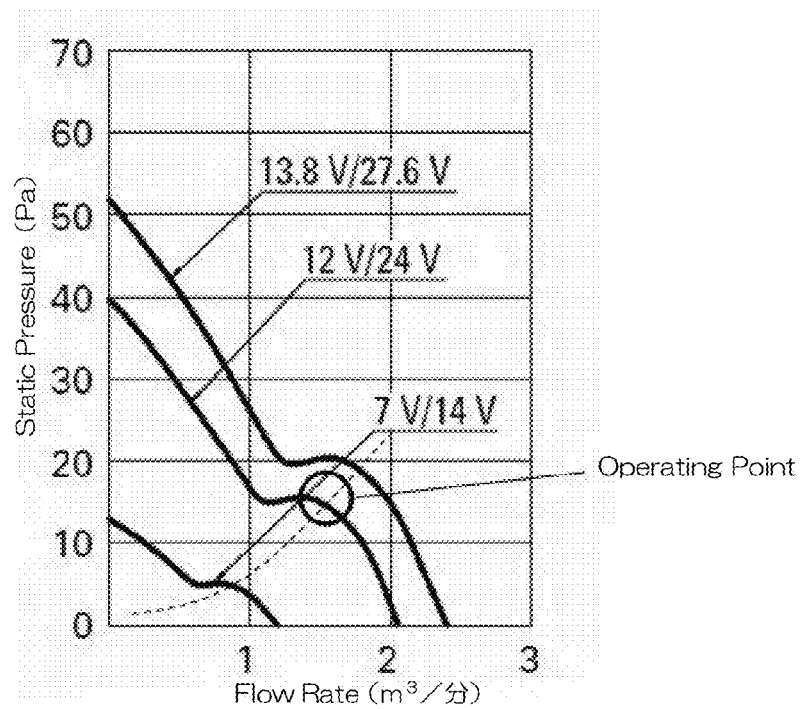
FIG. 20 shows an example of PQ characteristics of the fan.

A criterion for selecting the fan will be described referring to the example of a 52-inch liquid crystal display apparatus. Assume that cooling load for a 52-inch apparatus is about 300 W. Assume that the air circulating in the apparatus, while being stirred, is heated in the heat generating board area and cooled by the fins within a temperature range of 5° C. In order to move heat of about 300 W with heat capacity corresponding to an air temperature difference of 5° C., a flow rate of about 3.0 m³/min is required. If the flow rate is ensured by two fans, each fan is required to have capacity for supplying a flow rate of about 1.5 m³/min FIG. 20 shows PQ characteristics of a fan having a diameter of 120 mm, which is an example of a fan having such capacity. It is seen from FIG. 20 that a flow rate of 1.5 m³/min can be supplied under pressure loss of about 15 Pa (operation point) when DC power of 12 volts is supplied for operation. According to the arrangement for generating a circulating air flow in this example, a pressure difference of 15 Pa or less in the air circulation system is required in order to obtain the required flow rate. In case of a conventional heat dissipation structure having a large pressure difference, it is impossible to obtain the required flow rate and cooling depends on the temperature increase in the apparatus. An excessive temperature rise in the apparatus increases the possibility of insufficient cooling of components mounted therein.

Figure 21:
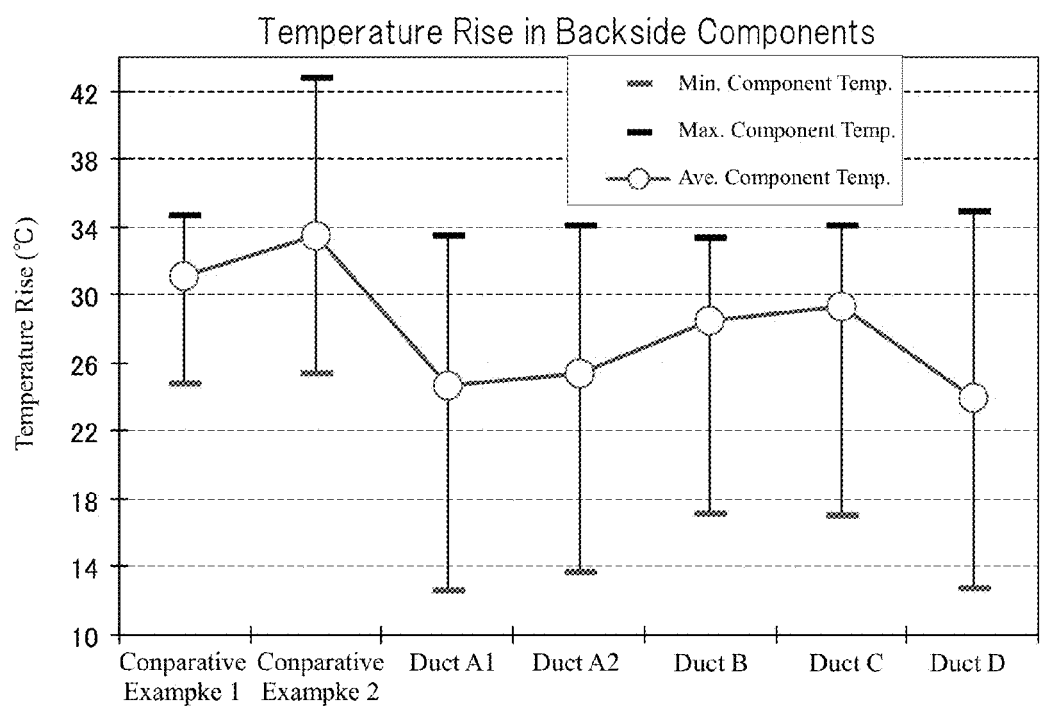
FIG. 21 is a graph showing the temperature of heat generating components in the present invention and in the comparative examples.

Finally, evaluation results of some configurations of the partition plates and the fans in actual apparatus will be described in order to confirm the advantage of the present invention. FIG. 21 shows the record of average, maximum and minimum temperatures of heat generating components mounted in the image display apparatus for each configuration. Comparative examples 1 and 2 have configurations for stirring air inside of the apparatus in a manner different from the partition plate of the present invention. The average temperature increase was between 32° C. and 34° C.

"Partition plate A1" is the structure shown in FIG. 18 with a large distance between fans (distance of 500 mm between the centers thereof). The fans exhaust air in the upward direction. "Partition plate A2" is a structure shown in FIG. 19, in which the air flow adjusting plates are added to the structure A1. The air flow adjusting plates control the air flow direction and effectively induce a circulating air flow. "Partition plate B" is a structure shown in FIG. 6 with a large distance between the fans. The fans are arranged downwardly and a through hole is provided in the center of the partition plate. "Partition plate C" is a structure shown in FIG. 15 except that the fans exhaust air in the downward direction. A small distance is provided between the fans (distance of 220 mm between the centers thereof) and air flow adjusting plates are not provided. Partition plates B and C exhibit an advantageous effect over the comparative examples. "Partition plate D" is a structure shown in FIG. 17 with a small distance between the fans (distance of 220 mm between the centers thereof). The fans exhaust air in the upward direction and the air flow adjusting plates are provided. This example recorded an average temperature increase of 24° C., which is nearly 10° C. lower than the cooling structure of the comparative example which only has a stirring effect. Partition plate A also exhibits an advantage over the comparative examples, recording an average temperature increase of about 25° C. Thus, the advantage of the present invention was confirmed.

The present invention has been described with reference to the embodiments and the examples, but the present invention is not limited to the embodiments and the examples described above. Various changes understandable to those skilled in the art may be made to the configuration and details of the present invention within the scope of the present invention.

This application claims priority based on Japanese Patent Application No. 2008-186178 filed Jul. 17, 2008, all the disclosure thereof being incorporated herein.

The invention claimed is:

1. An electronic apparatus comprising:
a housing that forms a sealed inner space;
a circuit unit that is provided in the inner space;
a first partition plate that is provided in the inner space and that has an upper/lower partition portion, wherein the upper/lower partition portion at least partially extends in a lateral direction above at least a part of the circuit unit and that terminates in front of both lateral sides of the housing, the first partition plate including a vertical extension that extends downward in a vertical direction from an end of the upper/lower partition portion, the end being located on one side of the housing;
a first fan provided through the upper/lower partition portion; and
a curved connection, the connection connecting the upper/lower partition portion with the vertical extension.

2. The electronic apparatus according to claim 1, wherein the fan is adapted to suck air from above the upper/lower partition portion and to exhaust the air toward below the upper/lower partition portion.

3. The electronic apparatus according to claim 1, wherein the fan is adapted to suck air from below the upper/lower partition portion and to exhaust the air toward above the upper/lower partition portion.

4. An electronic apparatus comprising:
a housing that forms a sealed inner space;
a circuit unit that is provided in the inner space;
a first partition plate that is provided in the inner space and that has an upper/lower partition portion, wherein the upper/lower partition portion at least partially extends in a lateral direction above at least a part of the circuit unit and that terminates in front of both lateral sides of the housing; and
a first fan provided through the upper/lower partition portion, the fan being adapted to suck air from below the upper/lower partition portion and to exhaust the air toward above the upper/lower partition portion,
wherein a pair of the fans is provided,
wherein the upper/lower partition portion extends in a horizontal direction, and
wherein the upper/lower partition portion includes air flow adjusting plates that are provided on an upper surface thereof, the air flow adjusting plates being located adjacent to the fans and closer to a center point than the fans, the center point being defined with regard to the horizontal direction, wherein the air flow adjusting plates are inclined toward the fans.

5. An electronic apparatus comprising:
a housing that forms a sealed inner space;
a circuit unit that is provided in the inner space;
a first partition plate that is provided in the inner space and that has an upper/lower partition portion, wherein the upper/lower partition portion at least partially extends in a lateral direction above at least a part of the circuit unit and that terminates in front of both lateral sides of the housing;
a first fan provided through the upper/lower partition portion, the fan being adapted to suck air from above the upper/lower partition portion and to exhaust the air toward below the upper/lower partition portion, a pair of fans being provided on the upper/lower partition portion through a pair of openings of the upper/lower partition portion; and
a through hole that is provided on the upper/lower partition portion between the pair of fans.

6. An electronic apparatus comprising:
a housing that forms a sealed inner space;
a circuit unit that is provided in the inner space;
a first partition plate that is provided in the inner space and that has an upper/lower partition portion, wherein the upper/lower partition portion at least partially extends in a lateral direction above at least a part of the circuit unit and that terminates in front of both lateral sides of the housing;
a first fan provided through the upper/lower partition portion; and
a second partition plate that is provided in the inner space, the second partition plate at least partially extending in the lateral direction below said at least a part of the circuit unit and terminating in front of both lateral sides of the housing.

7. The electronic apparatus according to claim 6, further comprising a second fan provided through the second partition plate.

8. A method of cooling an electronic apparatus, the apparatus including a housing that forms a sealed inner space and including a circuit unit provided in the inner space, the method comprising:
 causing a full circulation of air flow in the inner space from a portion of the inner space through the inner space and returned back to the portion of the inner space by:
  feeding the air in the inner space from a side of a lower surface of an upper/lower partition portion to a side of an upper surface of the upper/lower partition portion through an opening provided on the upper/lower partition portion, the upper/lower partition portion being provided in the inner space and extending horizontally in the inner space such that at least a part of the circuit unit is separated from an upper space of the upper/lower partition portion;
  guiding the air along the upper surface of the upper/lower partition portion toward side surfaces of the housing, the air being fed to the side of the upper surface of the upper/lower partition portion;
  cooling the air while guiding the air in a downward direction along the side surfaces of the housing, the air reaching the side surfaces of the housing; and
  guiding the cooled air in an upward direction toward the opening.

9. A method of cooling an electronic apparatus, the apparatus including a housing that forms a sealed inner space and including a circuit unit provided in the inner space, the method comprising:
 causing a full circulation of air flow in the inner space from a portion of the inner space through the inner space and returned back to the portion of the inner space by:
  feeding the air in the inner space from a side of an upper surface of an upper/lower partition portion to a side of a lower surface of the upper/lower partition portion through an opening provided on the upper/lower partition portion, the upper/lower partition portion being provided in the inner space and extending horizontally in the inner space such that at least a part of the circuit unit is separated from an upper space of the upper/lower partition portion;
  guiding the air toward lower portions of side surfaces of the housing, the air being fed to the side of the lower surface of the upper/lower partition; and
  cooling the air while guiding the air in an upward direction along the side surfaces of the housing, the air reaching the lower portions of the side surfaces of the housing.

\* \* \* \* \*